US00RE35884E

United States Patent [19]

Ellis

[11] E Patent Number: Re. 35,884

[45] Reissued Date of Patent: Sep. 1, 1998

[54] FLEXIBLE LEAD ASSEMBLY FOR MICROCHANNEL PLATE-BASED DETECTOR

[75] Inventor: Glenn Ellis, Charlton, Mass.

[73] Assignee: Galileo Electro-Optics Corporation, Sturbridge, Mass.

[21] Appl. No.: 806,495

[22] Filed: Feb. 20, 1997

Related U.S. Patent Documents

Reissue of:

[64] Patent No.: 5,391,874
Issued: Feb. 21, 1995
Appl. No.: 106,945
Filed: Aug. 17, 1993

[51] Int. Cl.[6] ..... G01T 1/28

[52] U.S. Cl. ..... 250/336.1; 250/207; 250/214 VT; 250/397; 313/103 CM; 313/105 CM; 361/749

[58] Field of Search ..... 361/749; 313/105 CM, 313/103 CM; 250/207, 214 VT, 336.1, 397

[56] References Cited

U.S. PATENT DOCUMENTS

| | | | |
|---|---|---|---|
| 3,896,308 | 7/1975 | Venables et al. | 250/305 |
| 4,672,193 | 6/1987 | Duchenois et al. | 250/207 |
| 4,868,394 | 9/1989 | Fukuhara et al. | 250/397 |

FOREIGN PATENT DOCUMENTS

| | | | |
|---|---|---|---|
| 4-206987 A | 7/1992 | Japan | 361/749 |

*Primary Examiner*—Constantine Hannaher
*Attorney, Agent, or Firm*—Watson Cole Grindle Watson, P.L.L.C.

[57] ABSTRACT

A microchannel plate (MCP)-based detector of reduced size employs a flexible multilayer printed circuit board as a lead assembly and enjoys increased ease of assembly and improved versatility.

35 Claims, 7 Drawing Sheets

FLEXIBLE LEAD ASSEMBLY FOR MICROCHANNEL PLATE-BASED DETECTOR

Matter enclosed in heavy brackets [ ] appears in the original patent but forms no part of this reissue specification; matter printed in italics indicates the additions made by reissue.

BACKGROUND OF THE INVENTION

The invention relates to microchannel plate (MCP) based detectors. In particular, the invention pertains to MCP-based detectors of reduced size and simplified manufacture having flexible electrical leads. The invention is especially useful in detectors for scanning electron microscopes (SEM), but is also useful in detectors for other applications.

MCP-based detectors are becoming widely accepted in SEM imaging applications requiring low beam energies and currents. Images have been obtained of uncoated dielectric samples without the usual charging effects and of semiconductor materials with little or no damage to surfaces which are sensitive to radiolytic effects. Useful images have been obtained with beam energies as low as 200 volts and currents as low as 1 picoamp.

The majority of MCP detectors for high gain applications are constructed by stacking a series of ceramic insulators, metal electrical contacts, MCPs and anodes in a specific configuration to achieve the proper spacing and alignment necessary for a functional detector. FIGS. 1A and 1B illustrate typical arrangements of known microchannel plate detectors. In FIG. 1A, the detector 10 has an aperture 11 through which an electron beam 12 is directed at a sample S. Back-scattered and secondary electrons 12' are detected. The detector 10 is a stacked arrangement including opposed housing elements 13 and 14, insulator 16, metal contact tab assemblies 18, anodes 20 and a pair of MCPs, namely input MCP 22A and output MCP 22B, in abutting relation having respective channels 24A and 24B disposed at an angle with respect to the detector axis 26 to form a chevron structure for reducing ion feedback. A shielded wiring harness 27 containing high voltage leads and anode leads 28 is employed to reduce noise. In particular, the anode leads are coaxial cables and an outer braided sheath 30 is employed as a ground.

FIG. 1B illustrates a MCP detector 32 which is similar to the arrangement of FIG. 1A except that the respective input and output MCPs 34A and 34B do not have a central beam aperture and the detector does not utilize a wiring harness.

As is well known to those skilled in the art, all MCP-based detectors operate in high vacuum ($10^{-5}$ torr or better) and require a high voltage potential across the MCPs to function. A typical chevron arrangement employing 2 MCPs (FIG. 1B) used to detect electrons would have the input face 35A of the input MCP 34A grounded, the output face 36B of the output MCP 34B biased at +2000 volts, and the anode 34 biased at +2200 volts. Thus, compatibility with a high voltage, high vacuum environment is essential for MCP-based detectors to be acceptable.

The devices illustrated in FIGS. 1A and 1B are relatively large being at least 5.2 mm and 7.0 mm thick and 25.4 mm and 50.8 mm in diameter respectively. The size of currently available MCP-based detectors causes difficulties when samples are manipulated in a SEM. The detector thickness limits the working distance, i.e., the distance between the bottom of the electron gun lens and the sample, and therefore the image resolution of the SEM; the diameter interferes with the sample when high tilt angles are used, as required in many semiconductor inspection procedures.

Reduction in the size of a MCP-based detector is thus desirable. However, it is important to consider the effect of the dimension on the electrical characteristics of the detector, so that, currently acceptable noise and sensitivity levels are met or exceeded.

Each layer in the detector has a separate function, and one or more assorted small parts are required for each layer of the assembly. The total number of parts required to assemble a conventional MCP-based detector is high. For example, thirty-one (31) parts are required for the detector 10, shown in FIG. 1A. Assembly of the device and the shielded harness is difficult and time consuming. Also, each of the many parts is made to high tolerance. Thus, the inventory required to achieve normal production is costly to maintain and control.

A simplified MCP-based detector is therefore desired having a smaller size and a lower number of parts. Also, a detector assembly is desired which is more readily adaptable to different instruments and applications and has a greater sensitivity and versatility.

SUMMARY OF THE INVENTION

The present invention is based upon the discovery that a flexible multilayer printed circuit board may be employed in a MCP-based detector of reduced size having improved sensitivity and improved versatility.

In one embodiment, the invention is directed to a detector for a scanning electron microscope (SEM). The detector comprises at least one microchannel plate (MCP) having input and output faces and a flexible lead assembly having a detector end, a connector end and intermediate lead portion. The detector end of the flexible lead assembly includes an electrode coupled to each face of the MCP and at least one anode for carrying output signals from the MCP. The flexible lead assembly is formed of alternating stacked layers of dielectric and electrically conductive material, one conductive layer for each of the electrodes and the anode.

In a particular embodiment of the invention, the detector comprises a stack of microchannel plates (MCPs); a flexible lead assembly including a detector end, a high voltage connector end and an intermediate lead portion; and hardware to secure the MCPs to the detector end of the lead assembly. The detector end of the flexible lead assembly includes high voltage electrodes for contacting the input and output faces of the MCP stack and at least one anode for collecting the amplified signal from the MCPs. The intermediate lead portion and the connector end of the flexible assembly are made up of multiple layers of electrically conductive metal traces separated by, and bonded to, insulating layers of dielectric. Additional layers of dielectric and electrically conductive traces are employed to provide shielding in the intermediate portion.

Alternative embodiments of the invention include a detector with a flexible lead assembly incorporating a single or multiple anode configuration, with or without a central aperture. Multiple anodes may consist of multiple concentric ring anodes, multiple radially segmented anodes or a combination of the two. Also, the conductive trace for each anode is shielded by flanked parallel traces on the same layer and by full width traces on layers separated by dielectric, both above and below the anode trace layer. A ground shield surrounds the intermediate portion along its length.

DESCRIPTION OF THE INVENTION

Figure 2:
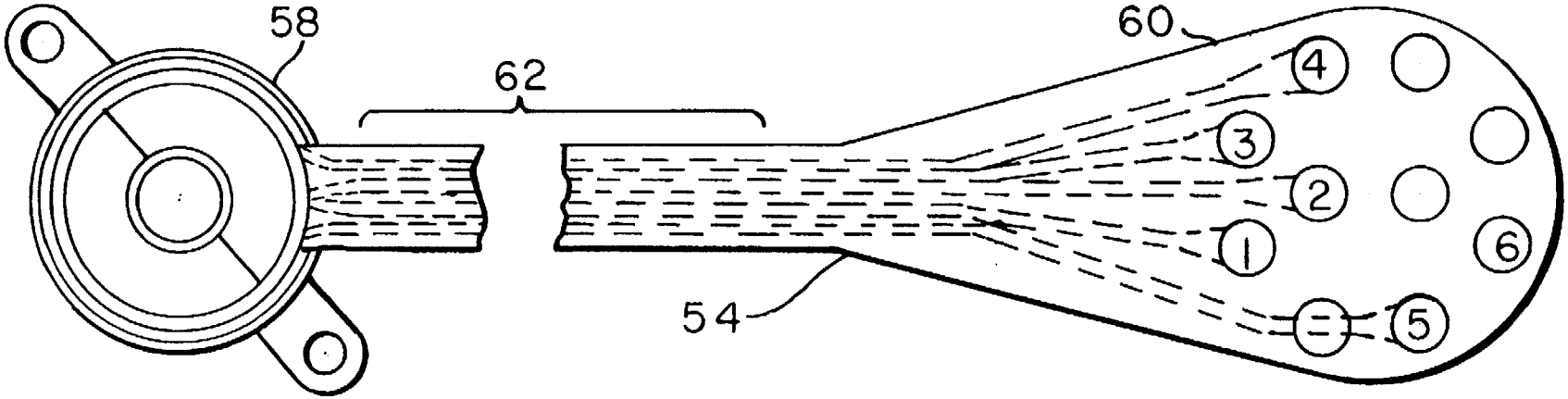
FIG. 2 is a fragmentary top plan view of the flexible lead assembly employed in the detector according to the invention.

The invention is generally directed to an areal detector for ions, electrons, UV photons and soft X-rays which utilizes a multilayer flexible circuit board as an integrated lead assembly. In a particular exemplary embodiment illustrated in FIGS. 2–7, the invention pertains to a microchannel plate (MCP)-based detector 50 employing a stack 51 of back-to-back microchannel plates 52A and 52B having an input face 53A and output face 53B, a multilayer flexible lead assembly 54 and hardware 56 to secure the MCPs to the lead assembly. The flexible lead assembly 54 shown in the plan view of FIG. 2 is an integrated multilayer laminated structure formed with a detector end 58, a high voltage connector end 60 and an intermediate lead portion 62. The invention is designed to operate in high-vacuum and all components are high-vacuum compatible.

Figure 6A:
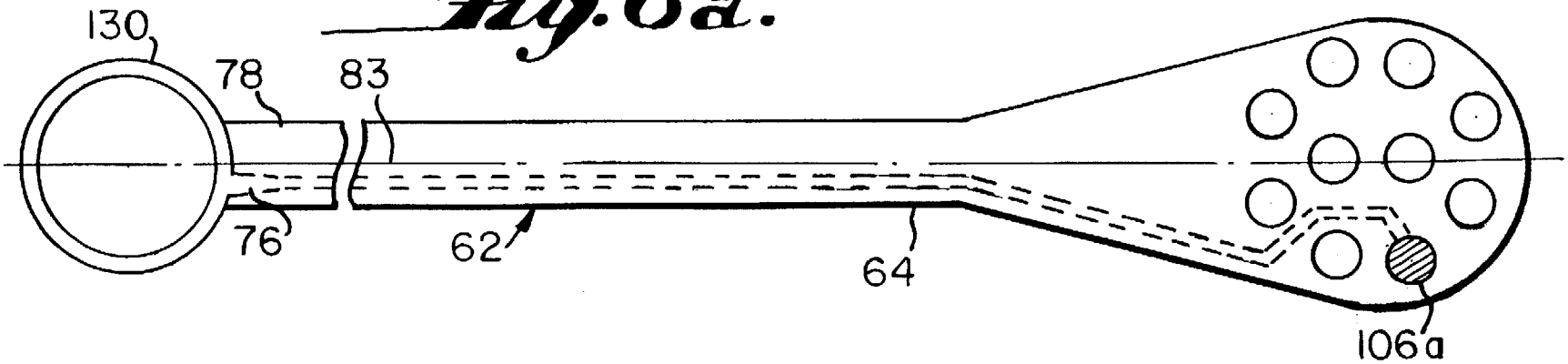
FIGS. 6A–6G are plan views of the various layers of the flexible lead assembly, including an alternative anode patterns.
Figure 6B:
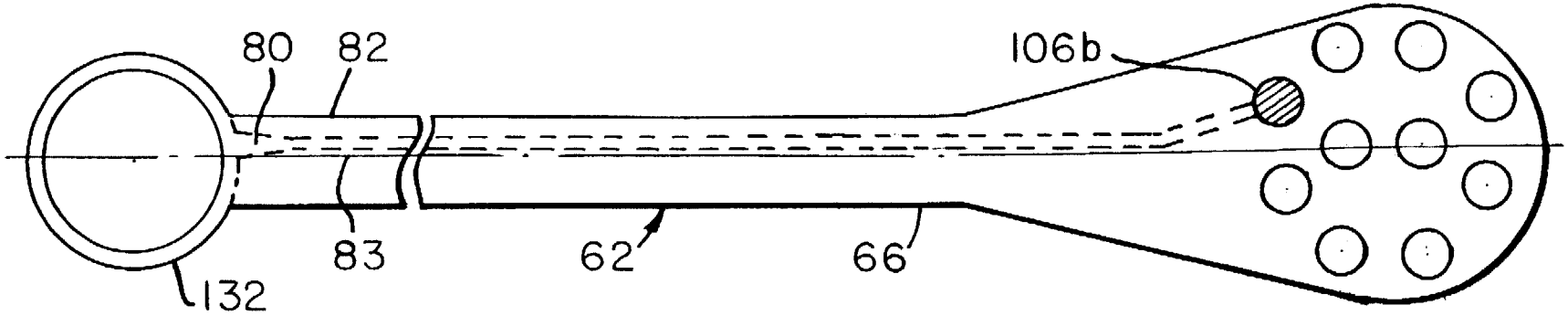
Figures 6C, 6D, 6E:
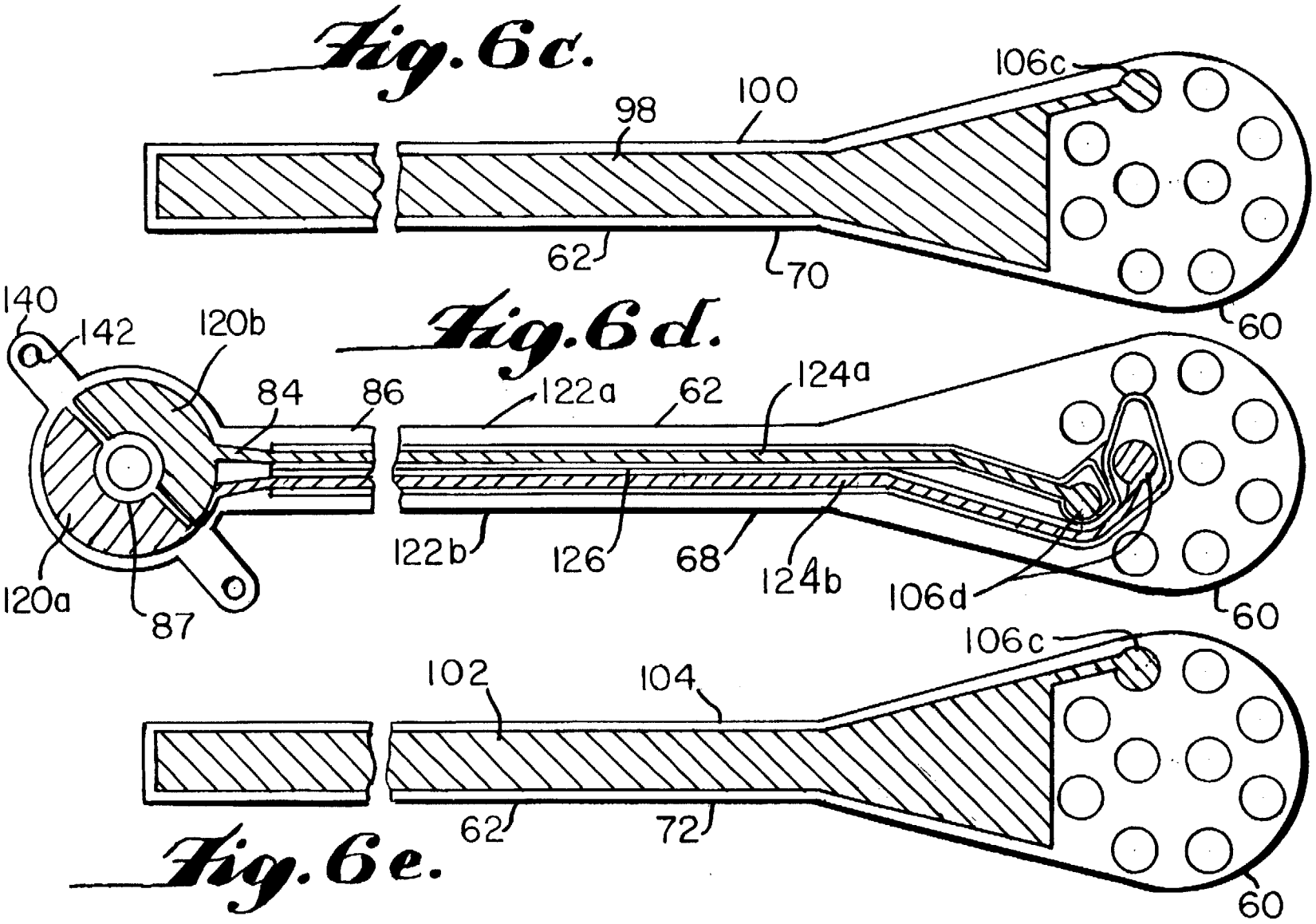

In the exemplary embodiment, the flexible lead assembly includes respective input and output layers 64 and 66 and an anode layer 68 (FIGS. 6A, 6B and 6D). In addition, in order to reduce noise, planar anode shielding layers 70 and 72 (FIGS. 6C and 6E) and a ground shielding layer 74 (FIG. 7) are provided in the intermediate portion 62 and extending from the detector end 58 into a proximate portion of the connector end 60.

Figure 5:
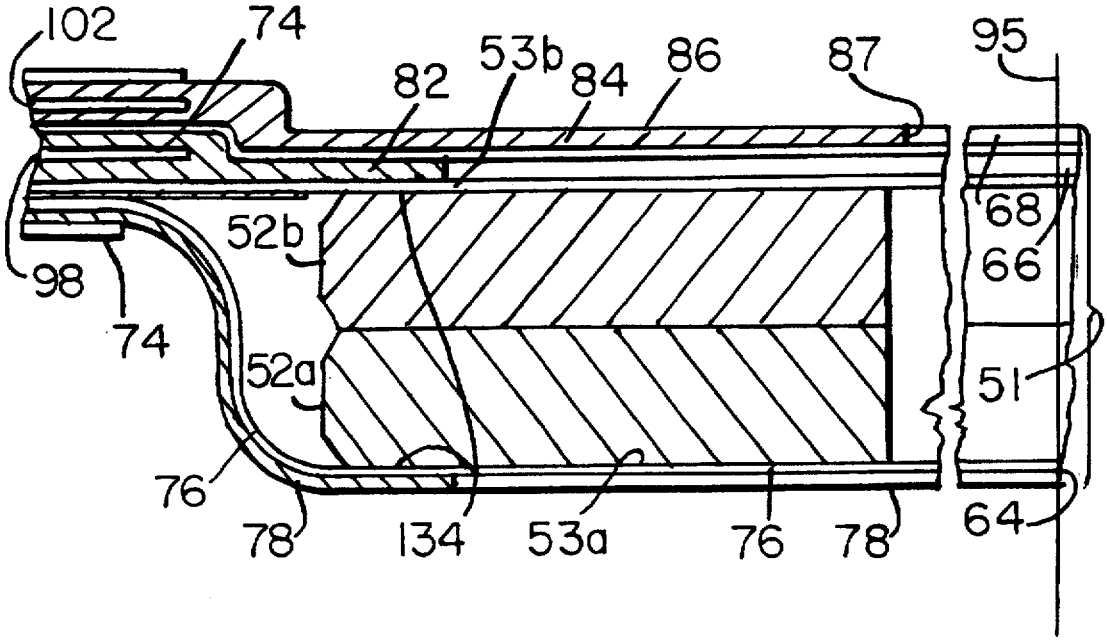
FIG. 5 is a fragmentary side sectional view taken along line 5—5 of FIG. 4 with the MCP shown in position and with the hardware deleted for clarity.

Referring to FIGS. 2, 5, 6A, 6B and 6D, the detector end 58 of the flexible lead assembly 54 is formed with the respective high voltage input and output electrode layers 64 and 66 disposed in confronting relationship and the anode layer 68. The input electrode layer 64 (FIG. 6A) comprises a metallized electrode 76 on a dielectric substrate 78. The output electrode layer 66 (FIG. 6B) comprises a metallized electrode 80 on a dielectric substrate 82. The metallized electrodes 76 and 80 face each other as shown in FIG. 5 and are disposed on the opposite sides of the longitudinal axis 83 in the intermediate portion 62. The anode layer 68 (FIG. 6D) comprises two metallized anodes 84 on a dielectric substrate 86. In the embodiment shown, the substrate 86 has a central aperture 87.

Figure 3:
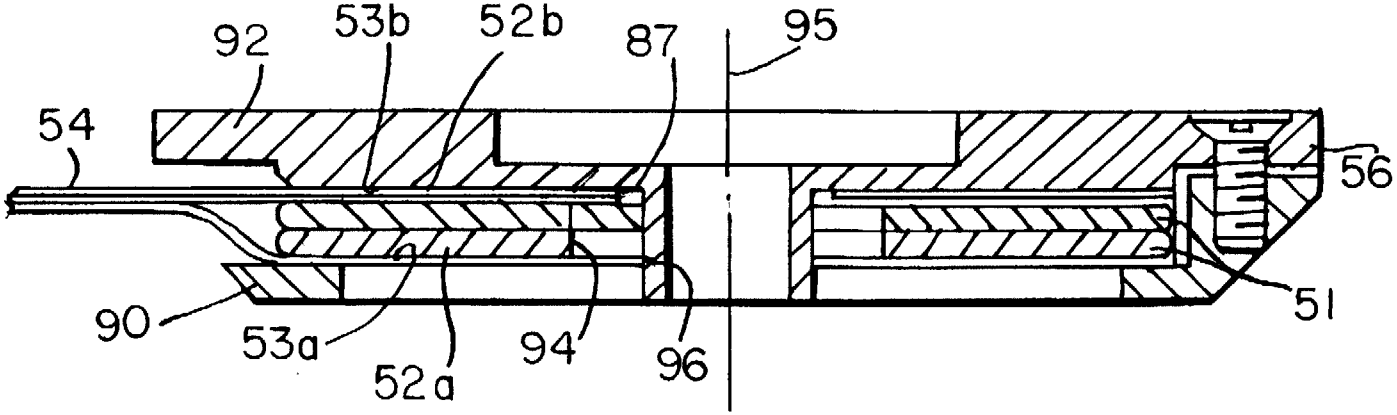
FIG. 3 is an enlarged side sectional view of the detector end of the MCP-based detector shown in FIG. 2.
Figure 4:
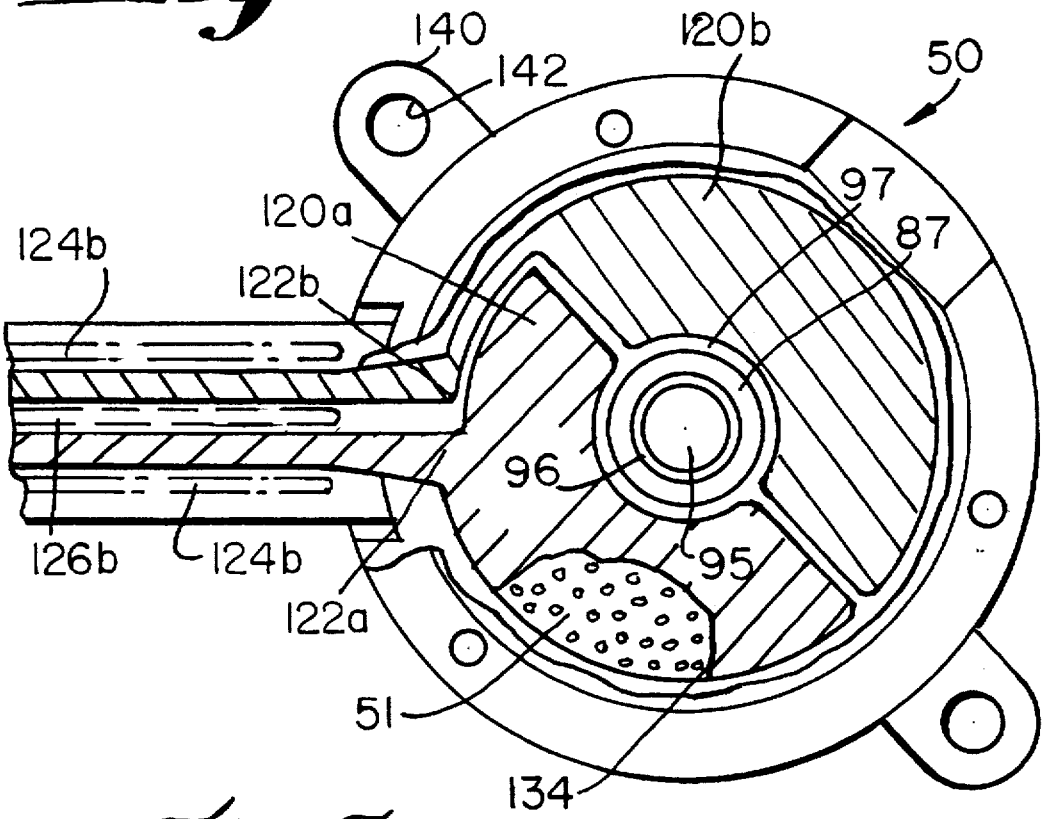
FIG. 4 is an enlarged bottom view of the detector end of the MCP-based detector according to the invention.

In the MCP-based detector 50, the stack 51 of microchannel plates 52A and 52B (MCPs) is sandwiched between the high voltage input electrode and high voltage output electrode layers 64 and 66 and the anode layer 68 is positioned adjacent the output electrode layer 66 facing the output face 53B of the stack 51, as seen in FIG. 5. The electrode layers 64 and 66, anode 68 and the MCP stack 51 at detector end 58 of the flexible lead assembly 54 are held together with the mechanical hardware 56 which comprises an annular ring 90 at the input side and an apertured backing plate 92 adjacent the anode, as seen in FIG. 3. In the embodiment illustrated, the MCPs 52A and 52B are each formed with a corresponding central aperture 94 aligned along a common central axis 95 of the stack 51. The backing plate 92 is formed with a central tube 96 which extends into the aperture 87 in the anode layer 68 and the aperture 94 in the MCPs along the central axis 95. Alternatively, the MCPs and the backing plate may be formed without the central apertures or the tube.

Figure 7:
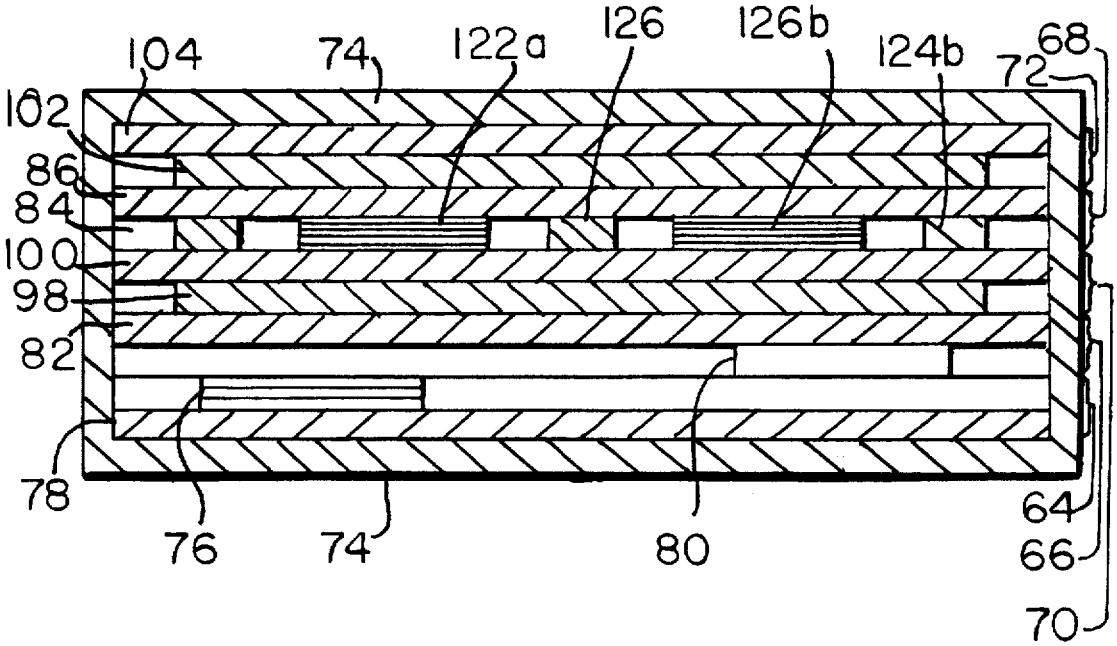
FIG. 7 is a sectional view of the intermediate lead portion taken along line 7—7 of FIG. 4.

The intermediate lead portion 62 includes the multiple layers of flexible printed circuit material corresponding to the layers noted above and in addition, incorporates the planar shield layers 70 and 72 and the outer ground layer 74 mentioned above. The planar shield layer 70 (FIG. 6C) comprises a metallized film 98 on a dielectric substrate 100 on one side of the anode layer 68 adjacent the output electrode layer 66, as seen in FIG. 7. The planar shield layer 72 (FIG. 6E) comprises metallized film 102 on a dielectric substrate 104 on the opposite side of the anode layer 68. The planar shield layers 70 and 72 terminate adjacent the detector end 58 and extend along the intermediate portion 62 to the connector end 60. The metallized films 98 and 102 extend partly into the connector end 60. The ground layer 74 comprises metallized film on the exterior surfaces of the dielectric material forming the various layers in the intermediate portion 62. Except for those portions of the electrode layers 64 and 66 and the anode 68 in the detector end, all of the layers are bonded together to form an integrated structure.

Each layer carries a separate metallized trace (e.g., copper) that relates to the specific functions of the flexible lead assembly 54. Each copper trace is terminated at the connector end 60 of the flexible lead assembly 54 with one or more corresponding plated through holes 106A–106C, each of which is positioned to mate with a specific pin of a high voltage connector, such as a vacuum compatible, high voltage, multi-pin connector.

The use of a flexible circuit board as a lead assembly for MCP-based detector has made possible a substantial reduction in both the size of the detector and the number of parts needed for assembly as compared with current practice. The reduction of the number of parts has lead to a reduction in the detector cost and an increase in the ease of assembly.

Figure 1A:
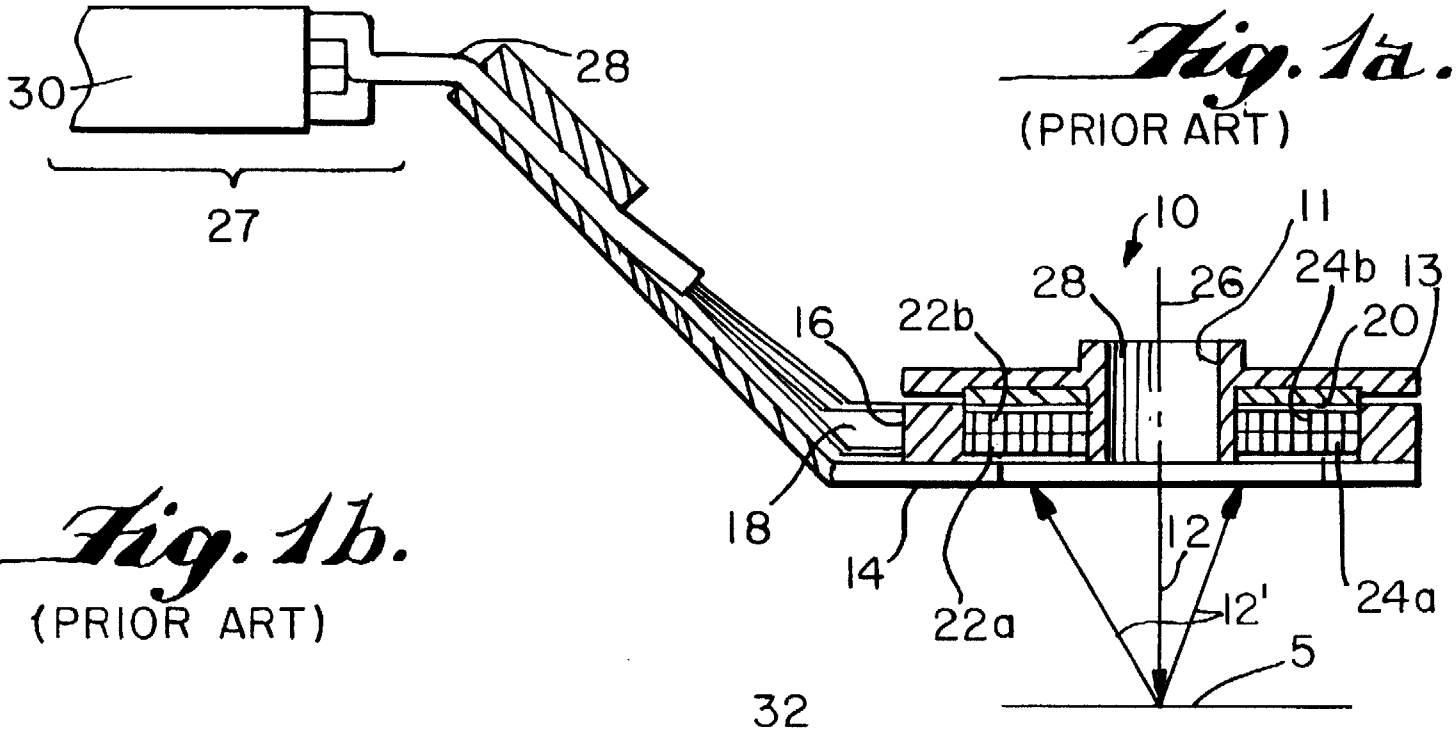
Fig. 1a. (PRIOR ART)
FIGS. 1A and 1B are side sectional illustrations of conventional MCP-based detectors.
Figure 1B:
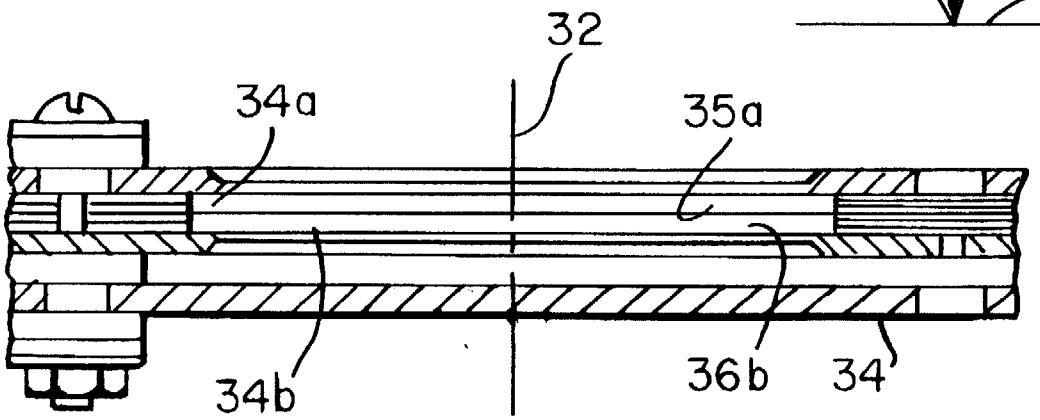
Fig. 1b. (PRIOR ART)

In an exemplary embodiment of the invention described herein, the flexible lead assembly 54 employed in the detector 50 replaces nineteen (19) separate components of the prior art device shown in FIG. 1A with a single structure that integrates the various functions. For example, the exemplary lead assembly 54 illustrated herein replaces two insulating rings, four metal contact tabs, one dual anode, conductive epoxy, four electrical leads, four braided shields, one insulating tube and two shield ties.

The use of a flexible lead assembly in the exemplary embodiment of the invention has allowed the thickness and outside diameter of the detector end 50 to be reduced to 2.8 mm and 17.2 mm respectively. This reduction in size has allowed for greater image resolution and increased space for sample manipulation as compared to the prior art.

Figure 8:
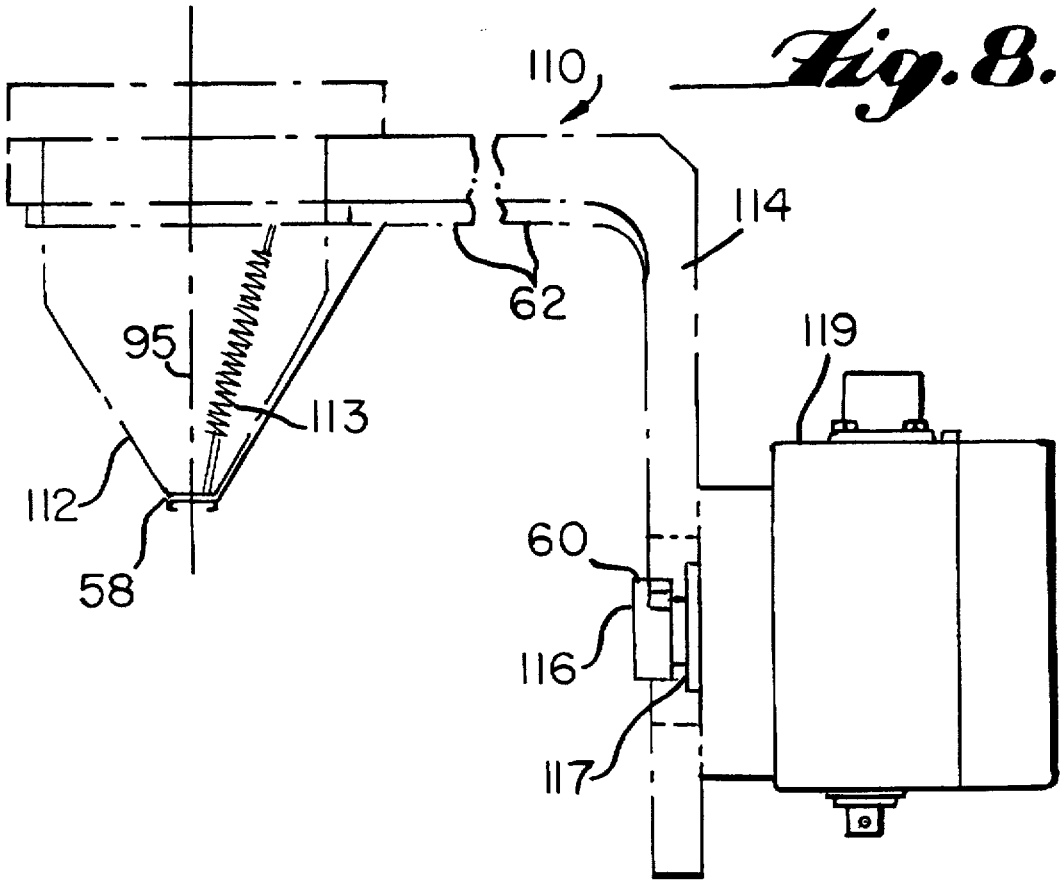
FIG. 8 is a schematic illustration of an MCP-based detector with a flexible lead assembly according to the invention mounted in the specimen chamber of a scanning electron microscope (SEM).

In a particular exemplary embodiment of the invention illustrated in FIG. 8, a MCP-based detector 50 is employed in a scanning electron microscope 110. The detector end 58 of the invention is mounted by means of springs 113 to the bottom of a lens 112 containing an electron gun and focusing elements (not shown) in the specimen chamber 114 of the SEM. The connector end 60 is coupled to a grounded housing 116 which plugs directly into a high voltage feed through 117 in a vacuum flange 118 on the side of the vacuum chamber 114. A signal is carried through the flange 118 to a preamplifier 119 where it is converted to useable input for creating a video image.

In the embodiment illustrated, the detector end 58 of the detector 50 contains the central tube 96 aligned with the central axis 95 through which the focused electron beam (not shown) from the electron gun in the lens 112 of the SEM 110 is passed. The tube 96 is part of the base hardware 56. The anode layer aperture 87 and MCP apertures 94 are aligned with the axis 95, as shown in FIG. 3.

The anode layer 68 in the exemplary embodiment is a diametrically split configuration including anode portions 120A and 120B, which allows for higher resolution imaging with two signal channels. The anode pattern shown in FIG. 6D is etched into the anode layer 68 of the flexible lead assembly 54. This layer consists of the metal film 84 (e.g., one ounce copper sheet), bonded to the dielectric substrate 86 (e.g., one mil (about 0.0254 mm) polyimide film). The copper is etched to form the anode pattern at the detector end and the anode leads 122A and 122B in the intermediate portion 62. In addition, flanking parallel shielding traces 124A and 124B and the central shielding trace 126 are formed in the anode layer 68 of the intermediate lead portion 62 and the connector end 60.

Figure 6F:
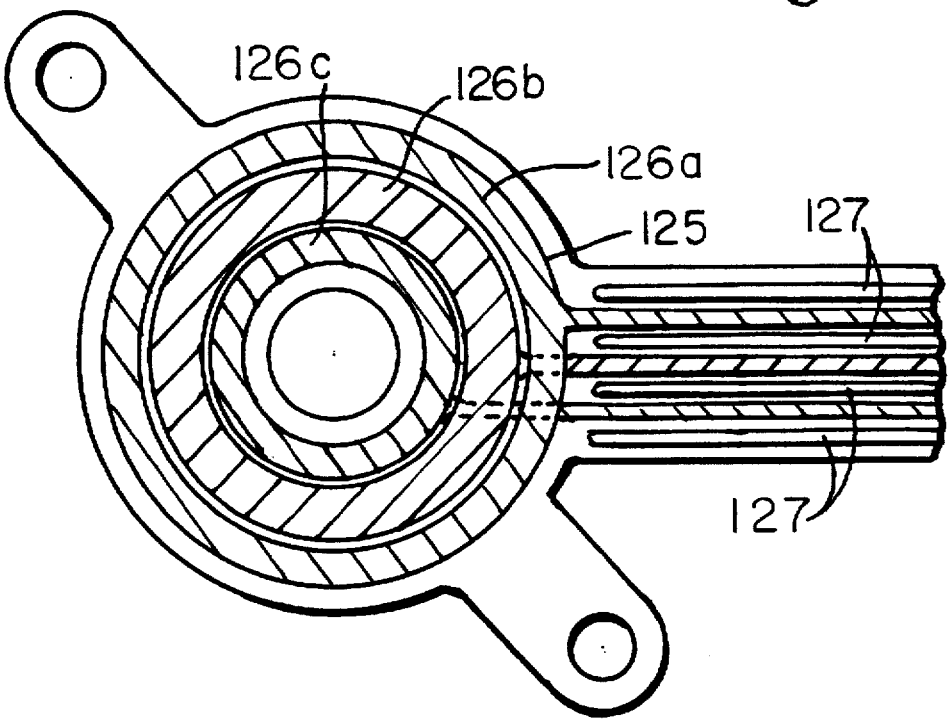
Figure 6G:
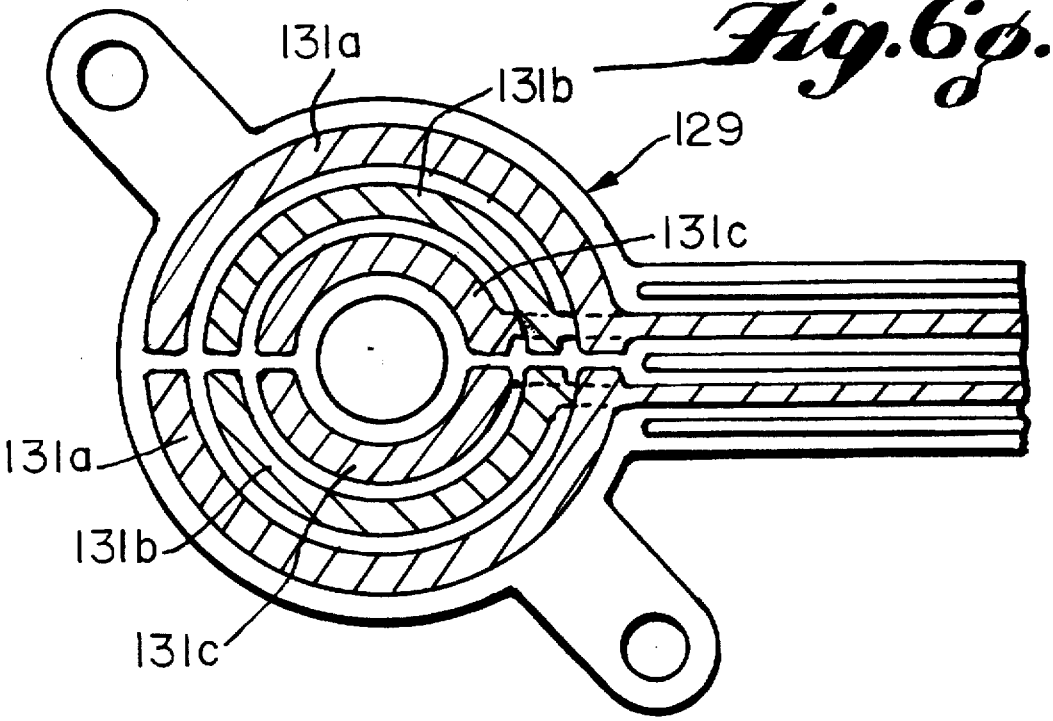

Alternative anode patterns are illustrated in FIGS. 6F and 6G. In FIG. 6F, a multilayer anode 125 having a concentric split anode pattern is illustrated. Each ring 126A, 126B and 126C is a metallized layer on a corresponding dielectric substrate.

In the intermediate lead portion 62 of the flexible lead assembly 54, the anode layer 68 is sandwiched between the two planar shield layers 70 and 72 containing respective full-width shield traces 98 and 102 with intermediate dielectric layers 100 and 86, as seen in FIG. 7. The full-width traces 98 and 102 are connected to the flanking parallel traces 124A and 124B and the central shielding trace 126 by means of a plated through hole 106F in the detector end 60 (FIG. 6D). The purpose of the shielding is to prevent cross-talk between the multiple anodes and to prevent interference from other sources of electrical noise that may be present in the SEM chamber.

The respective input and output electrode layers 64 and 66 of the flexible lead assembly 54 in the exemplary embodiment are constructed similarly to the anode layer 68 and include respective annular metallized (e.g., copper) rings 130 and 132 which make contact with the outer perimeter 134 of the respective input and output faces 53A and 53B of the MCP stack 51. The metal ring 132 of the output electrode 66 is bonded to the dielectric substrate 82 (e.g., 2 mil (about 0.052 mm) polyimide film) to provide adequate spacing between the MCP stack 51 and the anode 68. Likewise, the input electrode 64 for the MCP stack 51 is constructed similar to the output electrode and is mounted with its metal side 76 facing the metal side 80 of the input layer 66. The metal ring 130 makes contact with the outer perimeter of the input face 53A of the MCP 52A and the dielectric 78 (e.g., 1 mil (about 0.025 mm) polyimide) provides insulation between the MCP 52A and the cover hardware ring 90. Likewise, the metal ring 132 makes contact with the perimeter 134 of the output face 53B of MCP 52B. The input electrical layer 64 is also slightly longer than the output electrode layer 66 to compensate for the thickness of the MCP stack 51 which is sandwiched between the two electrodes in the hardware 56.

In the embodiment illustrated, the detector 50 is mounted to the bottom of the SEM electron gun lens by a pair of extension springs 113 fastened to the top of the of the lens. The anode layer 68 of the flexible lead assembly has a pair of apertured reinforcement mounting tabs 140 formed in the polyimide. Each tab 140 has a through hole 142 for attachment to the spring 113.

In the exemplary embodiment, the exterior surface of the lead portion 62 of the flexible lead assembly 54 is coated with evaporated metal 74 between the detector hardware 56 and the connector end 60. The metallization 74 serves two functions. First, it provides a grounded shield for noise reduction and second, it prevents the outer dielectric layers of the lead from electrostatically charging during operation of the SEM.

While there have been described what are at present considered to be the preferred embodiments of the present invention, it will be apparent to those skilled in the at that various changes and modifications may be made therein without departing from the invention, and it is intended in the appended claims to cover such changes and modifications as fall within the spirit and scope of the invention.

What is claimed is:

1. An areal detector for both charged and neutral particles and energetic photons comprising: at least one microchannel plate (MCP) having a signal input face and signal output face; a flexible circuit having a detector end, an intermediate electrical lead portion with electrical shielding means and a connector end, and means for supporting said at least one MCP in said detector end of the flexible circuit; said flexible circuit including a pair of electrodes one each coupled to the respective signal input face and signal output face of said at least one MCP and at least one anode for collecting electron current signals from the signal output face of said at least one MCP.

2. The detector of claim 1 further comprising a lead for each one of said pair of electrodes and a lead for the at least one anode being located in the intermediate electrical lead portion and extending between the detector end and the connector end.

3. The detector of claim 2 wherein said electrical shielding means substantially surrounds the anode lead in the intermediate electrical lead portion.

4. The detector of claim 2 further including electrical grounding surrounding the electrode leads and the anode lead in the intermediate lead portion.

5. The detector of claim 2 wherein the flexible circuit comprises a laminate of alternating stacked layers of dielectric and electrically conductive material, including at least one conductive trace for each of the electrodes, said at least one anode and the corresponding electrode leads, anode lead and the shielding means.

6. The detector of claim 5 wherein the shielding means includes shielding layers on opposite sides of each anode lead in the intermediate lead portion.

7. The detector of claim 5 wherein the anode comprises at least one conductive trace on a dielectric substrate.

8. The detector of claim 5 wherein the shielding means is disposed in the intermediate lead portion in spaced insulating relationship on opposite planar sides of the anode lead for the said at least one anode and on adjacent marginal edges of the anode lead.

9. The detector of claim 1 wherein the anode of the flexible circuit comprises a multiple anode adjacent to said signal output face comprising multiple concentric rings, multiple radial segments or a combination of the two.

10. The detector of claim 1 further comprising means for securing the at least one MCP to the detector end.

11. The detector of claim 1 wherein the detector end and the at least one MCP have aligned central apertures.

12. The detector of claim 1 wherein the respective input and output electrodes are each formed with a conductive ring portion for engaging peripheral portions of the respective input and output faces of the MCP.

13. The detector of claim [1] *10*, wherein the means for securing the at least one MCP to the detector end includes a ring portion for the input face of the detector and a backing plate for the anode.

14. The detector of claim 13 wherein the backing plate has an aperture and a central tube therein extending through a corresponding aperture in the detector end.

15. A detector comprising: a microchannel plate (MCP) having electrically conductive input and output faces and an integrated multilayer flexible circuit having a detector end, a connector end and intermediate lead portion with electrical shielding means, said flexible circuit including an electrode layer for each face of the MCP and at least one anode for receiving signals from the output face of the MCP.

16. The detector of claim 15 wherein the flexible circuit includes alternating stacked layers of dielectric and electrically conductive material, with at least one conductive trace for each electrode layer and the at least one anode and shielding means.

17. The detector of claim 15, wherein the anode comprises a plurality of segmented detector portions alignable with the output face of the MCP.

18. The detector of claim 15 wherein the anode is segmented radially.

19. The detector of claim 15 wherein the anode is segmented circumferentially.

20. The detector of claim 15 wherein the anode comprises a multilayer structure including a metallized film in a dielectric substrate.

21. The detector of claim 15 wherein the at least one anode includes a lead portion and the shielding means is disposed in the intermediate lead portion in spaced insulating relationship on opposite planar sides of the anode lead and adjacent marginal edges of the anode lead for shielding said anode lead from spurious noise.

22. A lead assembly for a microchannel plate (MCP)-based detector comprising an integrated multilayer flexible circuit having a detector end, a connector end and intermediate lead portion, said flexible circuit including an electrode layer for each face of the MCP and at least one anode for receiving signals from the output face of the MCP.

*23. An areal detector for both charged and neutral particles and energetic photons comprising: at least one microchannel plate (MCP) having a signal input face and signal output face; a flexible circuit having a detector end, an intermediate electrical lead portion and a connector end, and means for supporting said at least one MCP in said detector end of the flexible circuit; said flexible circuit including a plurality of electrodes one each coupled to the respective signal input face and signal output face of said at least one MCP and at least one anode for collecting electron current signals from the signal output face of said at least one MCP.*

*24. The detector of claim 23, wherein the intermediate lead portion includes at least one anode lead connecting the anode to the connector end.*

*25. The detector of claim 24, wherein the intermediate lead portion includes electrical shielding means substantially surrounding a portion of the at least one anode lead in the intermediate electrical lead portion.*

*26. The detector of claim 24 further including electrical grounding surrounding the electrodes in the intermediate lead portion.*

*27. A lead assembly for a microchannel plate (MCP)-based detector comprising: a flexible circuit having a detector end, a connector end and intermediate lead portion, said flexible circuit including an electrode layer for each face of the MCP and at least one anode.*

*28. A lead assembly for a microchannel plate (MCP)-based detector comprising: a plurality of flexible circuit layers each including a detector end, a connector end and intermediate lead portion arranged as a stacked array for engaging the MCP.*

*29. The detector of claim 28 wherein the stacked array comprises single flexible circuit layers.*

*30. The detector of claim 28 wherein each flexible circuit layer includes a conductive trace extending from the detector end to the connector end.*

*31. A lead assembly for a microchannel plate (MCP)-based detector comprising: a plurality of flexible circuit layers each including a detector end, a connector end and intermediate lead portion, said flexible circuit layers each including at least one of an electrode layer for a corresponding face of the MCP and an anode layer for receiving signals from the output face of the MCP.*

*32. The detector of claim 31 wherein the lead assembly comprises a stacked array of the flexible circuit layers.*

*33. The detector of claim 31 wherein each assembly comprises a stacked array of single flexible circuit layers.*

*34. The detector of claim 31 wherein each flexible circuit layer includes a conductive trace extending from the detector end to the connector end.*

*35. A lead arrangement for a microchannel plate (MCP) -based detector having an anode face and bias electrodes comprising:*

*at least one flexible anode circuit for the MCP including a detector end and an anode thereat for positionment in operative relationship with the anode face;*

*a connector end; and*

*an intermediate lead portion and an anode lead electrically connecting the anode and the connector end; and*

*at least one flexible electrode circuit for positionment in operative relationship with the bias electrodes including an electrode end and an electrode thereat;*

*a connector end; and*

*an intermediate lead portion and an electrode lead electrically connecting the electrode and the connector end.*

* * * * *